United States Patent
Yu et al.

(10) Patent No.: US 9,621,172 B1
(45) Date of Patent: Apr. 11, 2017

(54) PHASE-LOCKED LOOP CIRCUIT AND CALIBRATING METHOD THEREOF

(71) Applicant: Shenzhen South Silicon Valley Microelectronics Co., Limited, Hsinchu County (TW)

(72) Inventors: Tai-Yuan Yu, Hsinchu County (TW); Wei-Ming Chiu, Hsinchu County (TW); Ying-Tang Chang, Hsinchu County (TW)

(73) Assignee: SHENZHEN SOUTH SILICON VALLEY MICROELECTRONICS CO., LIMITED, Hsinshu County (TW)

( * ) Notice: Subject to any disclaimer, the term of this patent is extended or adjusted under 35 U.S.C. 154(b) by 0 days.

(21) Appl. No.: 15/189,445

(22) Filed: Jun. 22, 2016

(30) Foreign Application Priority Data

Feb. 26, 2016 (CN) .......................... 2016 1 0108922

(51) Int. Cl.
*H03L 7/06* (2006.01)
*H03L 7/107* (2006.01)
*H03L 7/089* (2006.01)

(52) U.S. Cl.
CPC .......... *H03L 7/1075* (2013.01); *H03L 7/0891* (2013.01)

(58) Field of Classification Search
USPC ........................................................ 327/157
See application file for complete search history.

(56) References Cited

U.S. PATENT DOCUMENTS

| | | | | |
|---|---|---|---|---|
| 6,441,660 | B1* | 8/2002 | Ingino, Jr. | H03K 3/0315 327/156 |
| 6,611,161 | B1* | 8/2003 | Kumar | H03L 7/0896 327/148 |
| 2011/0260760 | A1* | 10/2011 | Wu | H03L 7/0898 327/148 |
| 2013/0156076 | A1* | 6/2013 | Kinget | H04L 27/18 375/219 |

* cited by examiner

*Primary Examiner* — Lincoln Donovan
*Assistant Examiner* — Patrick Chen
(74) *Attorney, Agent, or Firm* — WPAT, PC; Justin King

(57) ABSTRACT

A calibrating method of a phase-locked loop circuit is provided. Firstly, a bias voltage of the phase-locked loop circuit is adjusted, so that the voltage controlled oscillator generates the oscillation signal with an initial frequency. Then, a charging current is used as a driving current and sent to a loop filter. Consequently, a tuned voltage is increased, and the frequency detector issues a first real count number. Then, a discharging current is used as the driving current and sent to the loop filter. Consequently, the tuned voltage is decreased, and the frequency detector issues a second real count number. Then, a ratio of a real loop gain to an ideal loop gain is calculated according to the first real count number and the second real count number. Moreover, a digital filter is adjusted according to the ratio.

13 Claims, 5 Drawing Sheets

PHASE-LOCKED LOOP CIRCUIT AND CALIBRATING METHOD THEREOF

This application claims the benefit of People's Republic of China Patent Application Serial No. 201610108922.3, filed Feb. 26, 2016, the subject matter of which is incorporated herein by reference.

FIELD OF THE INVENTION

The present invention relates to a phase-locked loop circuit and a control method thereof, and more particularly to a phase-locked loop circuit and a calibrating method for the phase-locked loop circuit.

BACKGROUND OF THE INVENTION

As known, a phase-locked loop (PLL) circuit can provide an accurate oscillation signal. Consequently, the phase-locked loop circuit is wirelessly used in a wireless communication system.

FIG. 1 is a schematic circuit diagram illustrating a conventional phase-locked loop circuit. As shown in FIG. 1, the phase-locked loop circuit 100 comprises a phase frequency detector (PFD) 110, a charge pump 120, a loop filter 130, a voltage controlled oscillator (VCO) 140 and a feedback circuit 150.

The phase frequency detector 110 receives a reference signal Sref and a feedback signal Sfb, and generates a control signal Sctrl.

The charge pump 120 comprises a charging path and a discharging path. A charging current with a magnitude Kpup is provided by the charging path. A discharging current with a magnitude Kpdn is provided by the discharging path. Moreover, the charge pump 120 receives the control signal Sctrl. According to the control signal Sctrl, a switch Swu in the charging path or a switch Swd in the discharging path is selectively turned on to generate a driving current Ic to the loop filter 130. In case that the switch Swu is turned on according to the control signal Sctrl, the driving current Ic is the charging current with the magnitude Kpup. In case that the switch Swd is turned on according to the control signal Sctrl, the driving current Ic is the discharging current with the magnitude Kpdn.

The loop filter 130 comprises an RC circuit. According to the driving current Ic from the charge pump 120, a charge/discharge control operation is performed on the RC circuit. Consequently, the loop filter 130 generates a tuned voltage Vtune to the voltage controlled oscillator 140. The RC circuit comprises two serially-connected resistors and a capacitor C. The resistance of each resistor is 2Rp. That is, the equivalent resistance of the loop filter 130 is equal to Rp.

The voltage controlled oscillator 140 receives the tuned voltage Vtune and generates an oscillation signal Sosc. As shown in FIG. 1, the voltage controlled oscillator 140 comprises a variable capacitance device 142. The variable capacitance device 142 receives the tuned voltage Vtune. When the tuned voltage Vtune is changed, the equivalent capacitance of the variable capacitance device 142 is correspondingly changed. Consequently, the frequency of the oscillation signal Sosc is changed.

The feedback circuit 150 comprises a frequency divider 152. The frequency divider 152 receives the oscillation signal Sosc and performs a frequency division on the oscillation signal Sosc. Consequently, the feedback signal Sfb is outputted from the frequency divider 152 to the phase frequency detector 110.

For assuring normal operations of the phase-locked loop circuit 100, it is important to calibrate the phase-locked loop circuit 100. During the calibrating process, it is necessary to calibrate the driving current Ic of the charge pump 120, the RC time constant of the loop filter 130 and the VCO gain Kvco of the voltage controlled oscillator 140. Generally, the calibrating process can be performed when the phase-locked loop circuit 100 is in an open-loop state or a closed-loop state.

For example, U.S. Pat. No. 8,483,985 discloses a PLL loop bandwidth calibration method. In addition, U.S. Pat. No. 8,421,507 discloses a phase-locked loop with a calibration function and an associated calibration method.

SUMMARY OF THE INVENTION

An embodiment of the present invention provides a phase-locked loop circuit. The phase-locked loop circuit includes a phase frequency detector, a charge pump, a loop filter, a voltage controlled oscillator and a feedback circuit. The phase frequency detector receives a reference signal and a feedback signal, and generates a control signal. The charge pump receives the control signal, and generates a driving current. The charge pump includes a first charging path, a first discharging path, a second charging path and a second discharging path. A first charging current is provided by the first charging path. A first discharging current is provided by the first discharging path. A second charging current is provided by the second charging path. A second discharging current is provided by the second discharging path. The loop filter receives the driving current, and generates a tuned voltage. The loop filter includes an RC circuit and a unit gain buffer. The RC circuit is connected with a node. The RC circuit generates the tuned voltage at the node according to the driving current. An input terminal of the unit gain buffer is connected with the node. The voltage controlled oscillator receives the tuned voltage, and generates an oscillation signal. The voltage controlled oscillator includes plural variable capacitance devices. A first variable capacitance device of the plural variable capacitance devices is connected with the node to receive the tuned voltage. The other variable capacitance devices of the plural variable capacitance devices are connected with an output terminal of the unit gain buffer through a switch so as to receive the tuned voltage. The feedback circuit includes a frequency divider and a frequency detector. The frequency divider performs a frequency division on the oscillation signal according to a divisor, so that the feedback signal is outputted from the frequency divider. The frequency detector counts the oscillation signal. During a calibrating process, the switch is in a closed state and the second charging current or the second discharging current is used as the driving current. During a normal operation, the switch is in an open state and the first charging current or the first discharging current is used as the driving current.

Another embodiment of the present invention provides a calibrating method for the phase-locked loop circuit. The calibrating method includes the following steps. Firstly, a bias voltage of the phase-locked loop circuit is adjusted, so that the voltage controlled oscillator generates the oscillation signal with an initial frequency. Then, the second charging current of the second charging path is controlled to be used as the driving current. The tuned voltage is increased by a first voltage change amount according to the driving current. Moreover, the frequency detector issues a first real count number. Then, the second discharging current of the second discharging path is controlled to be used as the driving current. The tuned voltage is decreased by a second voltage change amount according to the driving current. Moreover, the frequency detector issues a second real count number. Then, a ratio of a real loop gain to an ideal loop gain is calculated according to the first real count number and the second real count number, and the first charging current, the first discharging current, a RC time constant of the RC circuit or a VCO gain of the voltage controlled oscillator is adjusted according to the ratio.

Another embodiment of the present invention provides a phase-locked loop circuit. The phase-locked loop circuit includes a phase frequency detector, a charge pump, a loop filter, a voltage controlled oscillator, a feedback circuit and a digital signal processor. The phase frequency detector receives a reference signal and a feedback signal, and generates a control signal. The charge pump receives the control signal, and generates a driving current. The charge pump includes a first charging path, a first discharging path, a second charging path and a second discharging path. A first charging current is provided by the first charging path. A first discharging current is provided by the first discharging path. A second charging current is provided by the second charging path. A second discharging current is provided by the second discharging path. The loop filter receives the driving current, and generates a tuned voltage. The loop filter includes an RC circuit and a unit gain buffer. The RC circuit is connected with a node. The RC circuit generates the tuned voltage at the node according to the driving current. An input terminal of the unit gain buffer is connected with the node. The voltage controlled oscillator receives the tuned voltage, and generates an oscillation signal. The voltage controlled oscillator includes plural variable capacitance devices. A first variable capacitance device of the plural variable capacitance devices is connected with the node to receive the tuned voltage. The other variable capacitance devices of the plural variable capacitance devices are connected with an output terminal of the unit gain buffer through a switch so as to receive the tuned voltage. The feedback circuit includes a frequency divider and a frequency detector. The frequency divider performs a frequency division on the oscillation signal according to a divisor, so that the feedback signal is outputted from the frequency divider. The frequency detector counts the oscillation signal. The digital signal processor includes a loop gain calculation and calibration device and a digital filter. The loop gain calculation and calibration device adjusts the digital filter according to plural count numbers from the frequency detector. During a calibrating process, the switch is in a closed state and the second charging current or the second discharging current is used as the driving current. During a normal operation, the switch is in an open state and the first charging current or the first discharging current is used as the driving current.

Another embodiment of the present invention provides a calibrating method for the phase-locked loop circuit. The calibrating method includes the following steps. Firstly, a bias voltage of the phase-locked loop circuit is adjusted, so that the voltage controlled oscillator generates the oscillation signal with an initial frequency. Then, the second charging current of the second charging path is controlled to be used as the driving current. The tuned voltage is increased by a first voltage change amount according to the driving current. Moreover, the frequency detector issues a first real count number. Then, the second discharging current of the second discharging path is controlled to be used as the driving current. The tuned voltage is decreased by a second voltage change amount according to the driving current. Moreover, the frequency detector issues a second real count number. Then, a ratio of a real loop gain to an ideal loop gain is calculated according to the first real count number and the second real count number, and the digital filter is adjusted according to the ratio.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a phase-locked loop circuit and a calibrating method for the phase-locked loop circuit. When the phase-locked loop circuit is in an open-loop state, a calibrating process is performed, and a real loop gain of the phase-locked loop circuit is detected. Moreover, the calibrating process is performed according to the real loop gain. According to the present invention, it is not necessary to individually calibrate the driving current Ic of the charge pump, the RC time constant of the loop filter and the VCO gain Kvco of the voltage controlled oscillator.

Figure 2:
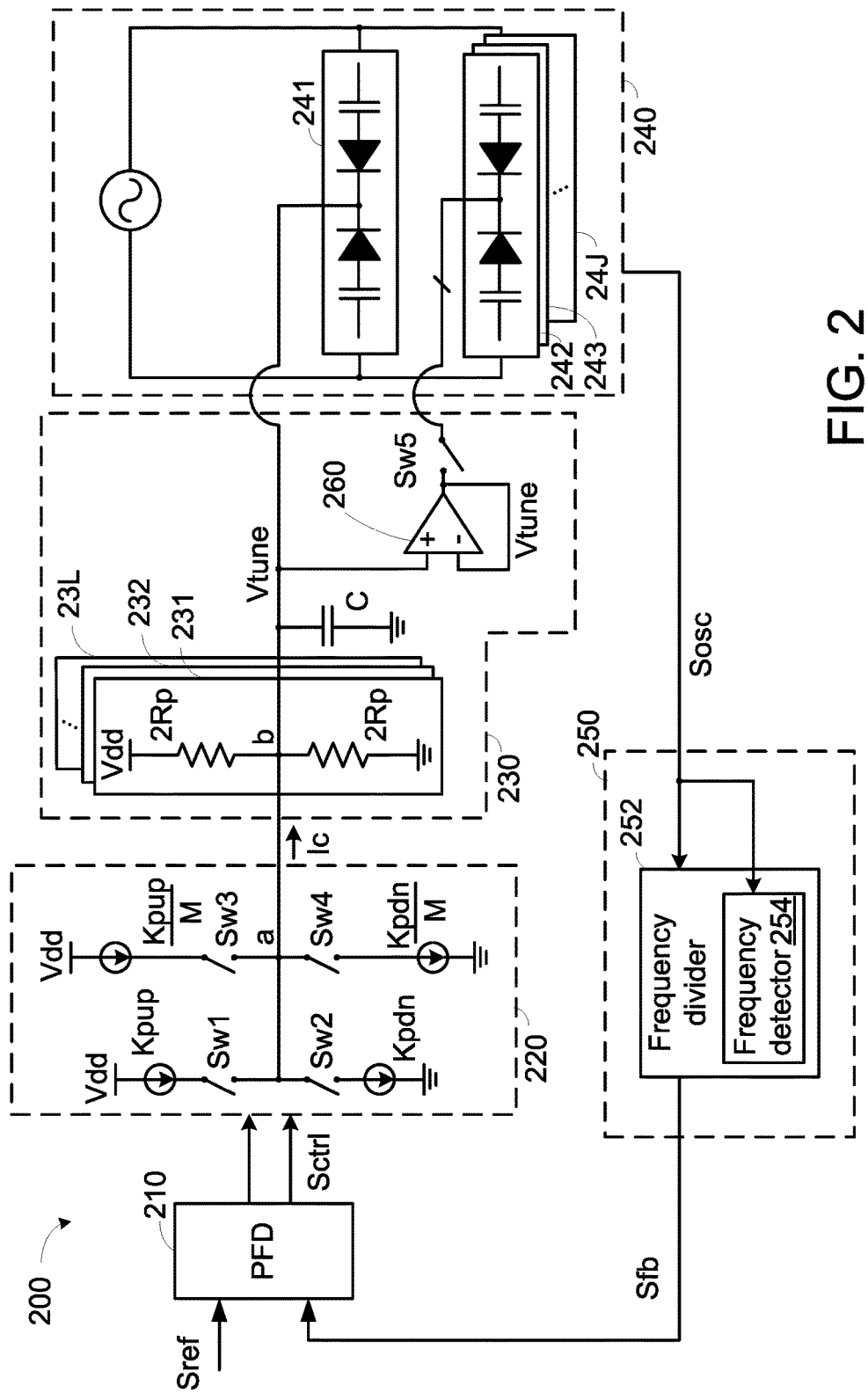
FIG. 2 is a schematic circuit diagram illustrating a phase-locked loop circuit according to a first embodiment of the present invention.

FIG. 2 is a schematic circuit diagram illustrating a phase-locked loop circuit according to a first embodiment of the present invention. As shown in FIG. 2, the phase-locked loop circuit 200 comprises a phase frequency detector (PFD) 210, a charge pump 220, a loop filter 230, a voltage controlled oscillator (VCO) 240 and a feedback circuit 250.

The phase frequency detector 210 receives a reference signal Sref and a feedback signal Sfb, and generates a control signal Sctrl.

The charge pump 220 comprises a first charging path, a first discharging path, a second charging path and a second discharging path. The first charging path and the second charging path are connected between a supply voltage Vdd and a node "a". The first discharging path and the second discharging path are connected between the node "a" and a ground terminal. A first charging current with a magnitude Kpup is provided by the first charging path, a second charging current with a magnitude Kpup/M is provided by the second charging path, a first discharging current with a magnitude Kpdn is provided by the first discharging path, and a second discharging current with a magnitude Kpdn/M is provided by the second discharging path, wherein M is larger than 1. That is, the second charging current is smaller than the first charging current, and the second discharging current is smaller than the first discharging current. Moreover, the second charging current is in proportion to the first charging current, and the second discharging current is in proportion to the first discharging current.

During a normal operation of the phase-locked loop circuit 200, the charge pump 220 receives the control signal Sctrl. Moreover, according to the control signal Sctrl, a switch Sw1 in the first charging path or a switch Sw2 in the first discharging path is selectively turned on to generate a driving current Ic to the loop filter 230. During a calibrating process of the phase-locked loop circuit 200, a switch Sw3 in the third charging path or a switch Sw4 in the second discharging path is selectively turned on to generate a driving current Ic to the loop filter 230.

That is, during the normal operation of the phase-locked loop circuit 200, the driving current Ic is the first charging current with the magnitude Kpup or the first discharging current with the magnitude Kpdn. Whereas, during the calibrating process of the phase-locked loop circuit 200, the driving current Ic is the second charging current with the magnitude Kpup/M or the second discharging current with the magnitude Kpdn/M.

As shown in FIG. 2, the loop filter 230 comprises an RC circuit and a unit gain buffer 260. According to the driving current Ic from the charge pump 220, a charge/discharge control operation is performed on the RC circuit. Consequently, the loop filter 230 generates a tuned voltage Vtune to the voltage controlled oscillator 240. Moreover, an input terminal of the unit gain buffer 260 is connected with a node "b" to receive the tuned voltage Vtune. Consequently, the tuned voltage Vtune is outputted from an output terminal of the unit gain buffer 260.

The RC circuit of the loop filter 230 comprises a capacitor C and at least one resistive circuit (e.g., plural resistive circuits 231~23L). The capacitor C is connected between the node "b" and the ground terminal. The resistive circuits 231~23L have the same circuitry configuration. In particular, each of the resistive circuits 231~23L comprises two resistors, wherein the resistance of each resistor is 2Rp. For example, in the first resistive circuit 231, one resistor is connected between the supply voltage Vdd and the node "b", and the other resistor is connected between the node "b" and the ground terminal. Since the RC circuit comprises L resistive circuits, the equivalent resistance of the RC circuit is equal to Rp/L, wherein L is an integer larger than or equal to 1.

In accordance with a feature of the present invention, only the first resistive circuit 231 of the loop filter 230 is enabled and the other resistive circuits 232~23L of the loop filter 230 are disabled during the normal operation of the phase-locked loop circuit 200. Moreover, all of the resistive circuits 231~23L are enabled during the calibrating process of the phase-locked loop circuit 200.

The voltage controlled oscillator 240 receives the tuned voltage Vtune and generates an oscillation signal Sosc. As shown in FIG. 2, the voltage controlled oscillator 240 comprises plural variable capacitance devices 241~24J. All of the variable capacitance devices 241~24J receive the tuned voltage Vtune. When the tuned voltage Vtune is changed, the equivalent capacitance of the variable capacitance devices 241~24J is correspondingly changed. Consequently, the frequency of the oscillation signal Sosc is changed.

Please refer to FIG. 2 again. The first variable capacitance device 241 of the voltage controlled oscillator 24 is connected with the node "b", and the other variable capacitance devices 242~24J of the voltage controlled oscillator 24 are connected with the output terminal of the unit gain buffer 260 through a switch Sw5. During the calibrating process of the phase-locked loop circuit 200, the switch Sw5 is in a close state and thus all of the variable capacitance devices 241~24J are enabled. During the normal operation of the phase-locked loop circuit 200, the switch Sw5 is in an open state and thus only the first variable capacitance device 241 is enabled. In some embodiments, the switch Sw5 is further connected with a DC voltage (not shown). Consequently, when the switch Sw5 is in the open state, the capacitances of the other variable capacitance devices 242~24J are minimized. Consequently, the influence on the normal operation is reduced.

In this embodiment, the feedback circuit 250 comprises a frequency divider 252 and a frequency detector 254. According to the practical requirements, the frequency detector 254 is installed in the frequency divider 252 or disposed outside the frequency divider 252. The frequency divider 252 receives the oscillation signal Sosc and performs a frequency division on the oscillation signal Sosc according to a divisor. Consequently, the feedback signal Sfb is outputted from the frequency divider 252 to the phase frequency detector 210. Moreover, during the calibrating process of the phase-locked loop circuit 200, the frequency detector 254 generates a count number according to the oscillation signal Sosc and thus calculates the frequency of the oscillation signal Sosc.

Figure 1:
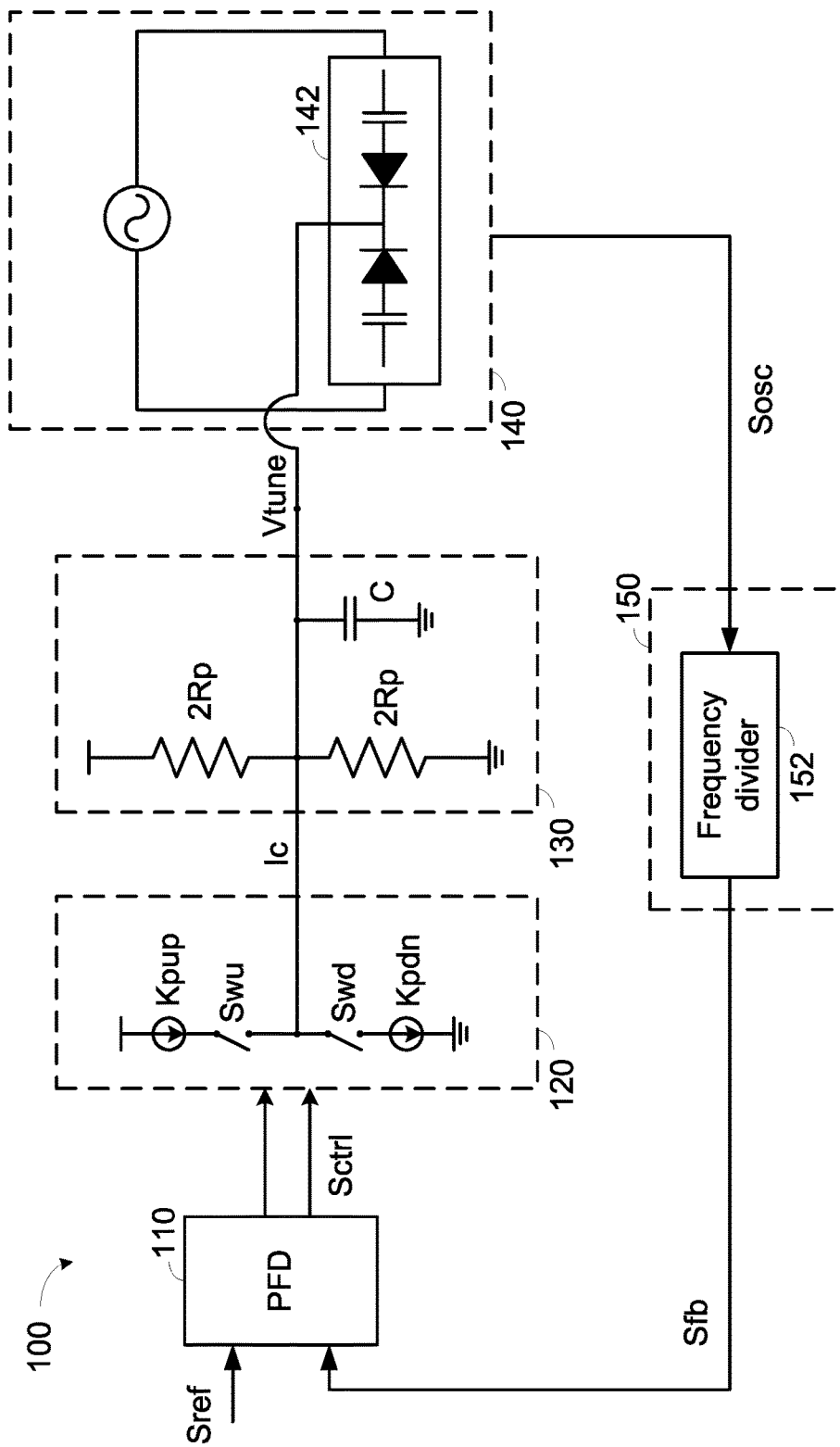
FIG. 1 (prior art) is a schematic circuit diagram illustrating a conventional phase-locked loop circuit.

From the above descriptions, during the normal operation of the phase-locked loop circuit 200, the second charging circuit, the second discharging circuit, the resistive circuits 232~23L, the variable capacitance devices 242~24L and the frequency detector 254 are disabled. In other words, the operating principles of the phase-locked loop circuit 200 during the normal operation are similar to those of the conventional phase-locked loop circuit of FIG. 1. The calibrating process of the phase-locked loop circuit 200 will be illustrated in more details as follows.

Figure 3:
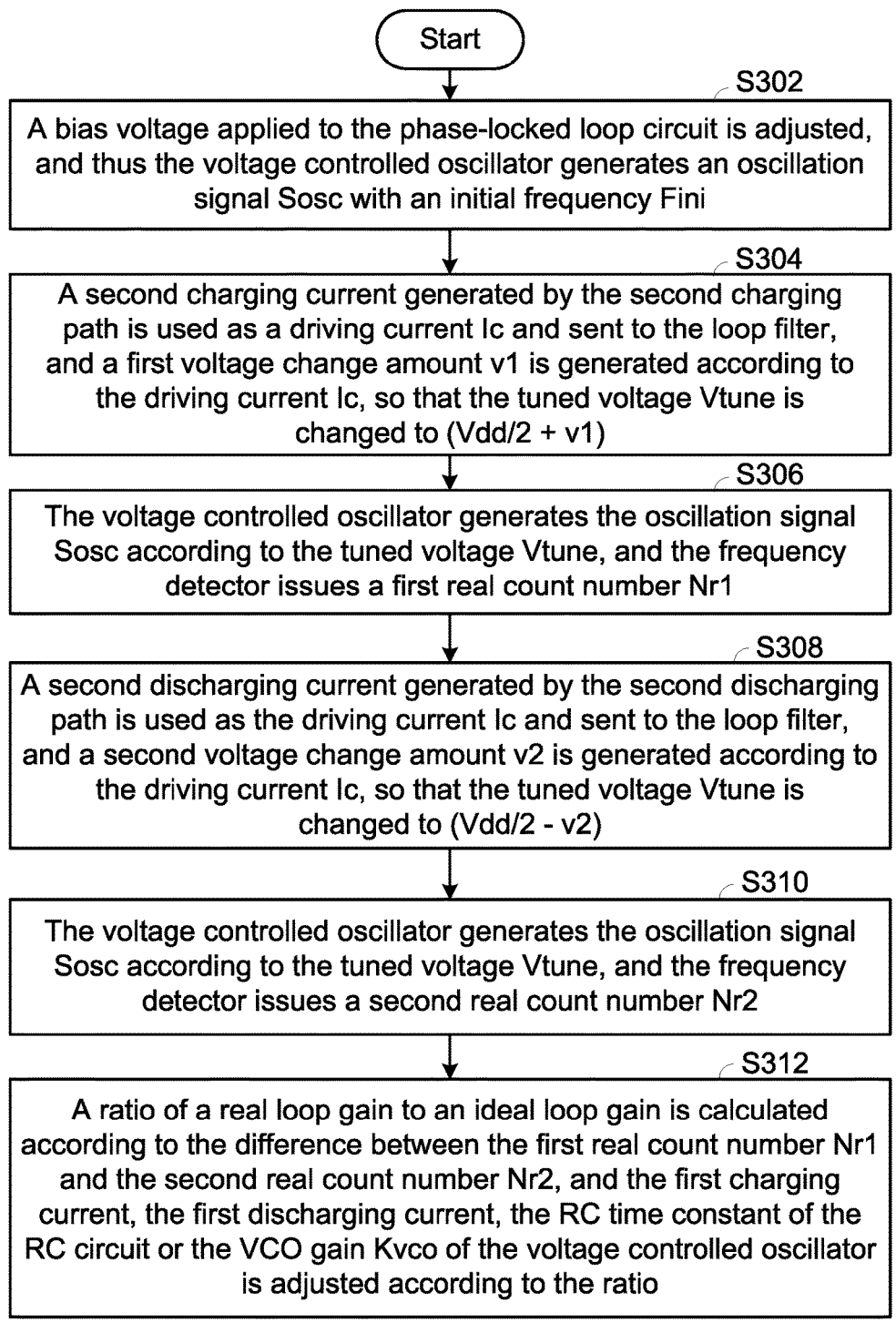
FIG. 3 is a flowchart illustrating a calibrating process of the phase-locked loop circuit according to an embodiment of the present invention.

FIG. 3 is a flowchart illustrating a calibrating process of the phase-locked loop circuit according to an embodiment of the present invention. For brevity, it is assumed that the current magnitude Kpup is equal to the current magnitude Kpdn.

Firstly, a bias voltage applied to the phase-locked loop circuit 200 is adjusted. Consequently, the voltage controlled oscillator 240 generates an oscillation signal Sosc with an initial frequency Fini (Step S302). In this step, the tuned voltage Vtune is adjusted to be one half of the supply voltage (i.e., Vtune=Vdd/2), and the tuned voltage Vtune is sent to the J variable capacitance devices 241~24J. Consequently, the oscillation signal Sosc with the initial frequency Fini is outputted from the voltage controlled oscillator 240.

Then, the switch Sw3 is turned on, and thus a second charging current generated by the second charging path is used as a driving current Ic and sent to the loop filter 230. According to the driving current Ic, a first voltage change amount $\Delta v1$ is generated by the loop filter 230. Consequently, the tuned voltage Vtune is changed to (Vdd/2+$\Delta v1$) (Step S304).

Then, the voltage controlled oscillator 240 generates the oscillation signal Sosc according to the tuned voltage Vtune, and the frequency detector 254 issues a first real count number Nr1 (Step S306). For example, the frequency detector 254 counts the number of signal edges of the oscillation signal Sosc in a time interval Tw, and thus the first real count number Nr1 is obtained. Moreover, the first real count number Nr1=floor (Fr1×Tw), where Fr1 is a first real frequency of the oscillation signal Sosc. Consequently, Fr1=Nr1/Tw+ϵ, where ϵ is an error source, and 0≤ϵ≤1/Tw.

Then, the switch Sw4 is turned on, and thus a second discharging current generated by the second discharging path is used as the driving current Ic and sent to the loop filter 230. According to the driving current Ic, a second voltage change amount Δv2 is generated by the loop filter 230. Consequently, the tuned voltage Vtune is changed to (Vdd/2−Δv2) (Step S308).

Then, the voltage controlled oscillator 240 generates the oscillation signal Sosc according to the tuned voltage Vtune, and the frequency detector 254 issues a second real count number Nr2 (Step S310). Similarly, the frequency detector 254 counts the number of signal edges of the oscillation signal Sosc in the time interval Tw, and thus the second real count number Nr2 is obtained. Moreover, the second real count number Nr2=floor (Fr2×Tw), where Fr2 is a second real frequency of the oscillation signal Sosc. Consequently, Fr2=Nr2/Tw+ϵ, where ϵ is an error source, and 0≤ϵ≤1/Tw.

Then, a ratio of a real loop gain to an ideal loop gain is calculated according to the difference between the first real count number Nr1 and the second real count number Nr2, and the first charging current, the first discharging current, the RC time constant of the RC circuit or the VCO gain Kvco of the voltage controlled oscillator is adjusted according to the ratio (Step S312).

Ideally, when the tuned voltage Vtune is equal to one half of the supply voltage (i.e., Vtune=Vdd/2), the initial frequency Fini of the oscillation signal Sosc is obtained according to the following mathematic formula:

$$Fini = Vtune \cdot J \cdot Kvco = \left(\frac{Vdd}{2}\right) \cdot J \cdot Kvco$$

In case that a second charging current with a magnitude Kpup/M is provided by the second charging path of the charge pump 220, the first voltage change amount Δv1 and the tuned voltage Vtune comply with the following mathematic formulae:

$$\Delta v1 = \frac{Kpup}{M} \cdot \frac{Rp}{L}$$

$$Vtune = \frac{Vdd}{2} + \Delta v1 = \frac{Vdd}{2} + \frac{Kpup}{M} \cdot \frac{Rp}{L} = \frac{Vdd}{2} + \frac{Kpavg + Kpmis/2}{M} \cdot \frac{Rp}{L}$$

In the above mathematic formula, Kpup=Kpavg+Kpmis/2, Kpavg is the average of Kpup, and Kpmis/2 is a mismatch value of Kpup.

Since all of the J variable capacitance devices 241~24J of the voltage controlled oscillator 240 receive the tuned voltage Vtune, a first ideal frequency Fi1 of the outputted oscillation signal Sosc complies with the following mathematic formula:

$$Fi1 = Vtune \cdot J \cdot Kvco = \left(\frac{Vdd}{2} + \frac{Kpavg + Kpmis/2}{M} \cdot \frac{Rp}{L}\right) \cdot J \cdot Kvco$$

$$= Fini + \frac{Kpavg + Kpmis/2}{M} \cdot \frac{Rp}{L} \cdot J \cdot Kvco$$

Similarly, in case that a second discharging current with a magnitude Kpdn/M is provided by the second discharging path of the charge pump 220, the second voltage change amount Δv2, the tuned voltage Vtune and a second ideal frequency Fi2 comply with the following mathematic formulae:

$$\Delta v2 = \frac{Kpdn}{M} \cdot \frac{Rp}{L}$$

$$Vtune = \frac{Vdd}{2} - \Delta v2 = \frac{Vdd}{2} - \frac{Kpdn}{M} \cdot \frac{Rp}{L} = \frac{Vdd}{2} - \frac{Kpavg - Kpmis/2}{M} \cdot \frac{Rp}{L}$$

$$Fi2 = Vtune \cdot J \cdot Kvco = \left(\frac{Vdd}{2} - \frac{Kpavg - Kpmis/2}{M} \cdot \frac{Rp}{L}\right) \cdot J \cdot Kvco$$

$$= Fini - \frac{Kpavg + Kpmis/2}{M} \cdot \frac{Rp}{L} \cdot J \cdot Kvco$$

Consequently, the difference between the first ideal frequency Fi1 and the second ideal frequency Fi2 is obtained according to the following mathematic formula:

$$Fi1 - Fi2 = \left(Fini + \frac{Kpavg + Kpmis/2}{M} \cdot \frac{Rp}{L} \cdot J \cdot Kvco\right) - \left(Fini - \frac{Kpavg - Kpmis/2}{M} \cdot \frac{Rp}{L} \cdot J \cdot Kvco\right) = \frac{2 \cdot Kpavg}{M} \cdot \frac{Rp}{L} \cdot J \cdot Kvco$$

As mentioned above, the difference between the first ideal frequency Fi1 and the second ideal frequency Fi2 indicates an ideal loop gain LGi of the phase-locked loop circuit 200. That is, the manufacturer of the phase-locked loop circuit 200 can determine the first ideal frequency Fi1 and the second ideal frequency Fi2 according to the current magnitude Kpup, the current magnitude Kpdn, the resistance Rp and the VCO gain Kvco, and further calculate a first ideal count number Ni1 and a second ideal count number Ni2 in the time interval Tw according to the first ideal frequency Fi1 and the second ideal frequency Fi2. That is, Ni1=Fi1× Tw, and Ni2=Fi2×Tw.

Moreover, for the phase-locked loop circuit 200, a ratio of the real loop gain LGr to the ideal loop gain LGi is obtained according to the following mathematic formula:

$$\frac{LGr}{LGi} = \frac{Fr1 - Fr2}{Fi1 - Fi2} = \frac{(Nr1 - Nr2)/Tw}{(Ni1 - Ni2)/Tw} = \frac{(Nr1 - Nr2)}{(Ni1 - Ni2)} = \frac{\Delta Nr}{\Delta Ni}$$

That is, after the difference ΔNr between the first real count number Nr1 and the second real count number Nr2 is divided by the difference ΔNi between the first ideal count number Ni1 and the second ideal count number Ni2, the ratio of the real loop gain LGr to the ideal loop gain LGi for the phase-locked loop circuit 200 is obtained.

From the above descriptions, during the calibrating process of the phase-locked loop circuit 200, the oscillation signal Sosc is adjusted to be operated at two different frequencies and the numbers of signal edges of the oscillation signal Sosc in the time interval Tw are counted. According to the difference between the two count numbers, a ratio of the real loop gain to the ideal loop gain is calculated. Moreover, the first charging current, the first discharging current, the RC time constant of the RC circuit or the VCO gain Kvco of the voltage controlled oscillator is adjusted according to the ratio. Consequently, the loop gain of the phase-locked loop circuit 20 can be compensated.

Figure 4:
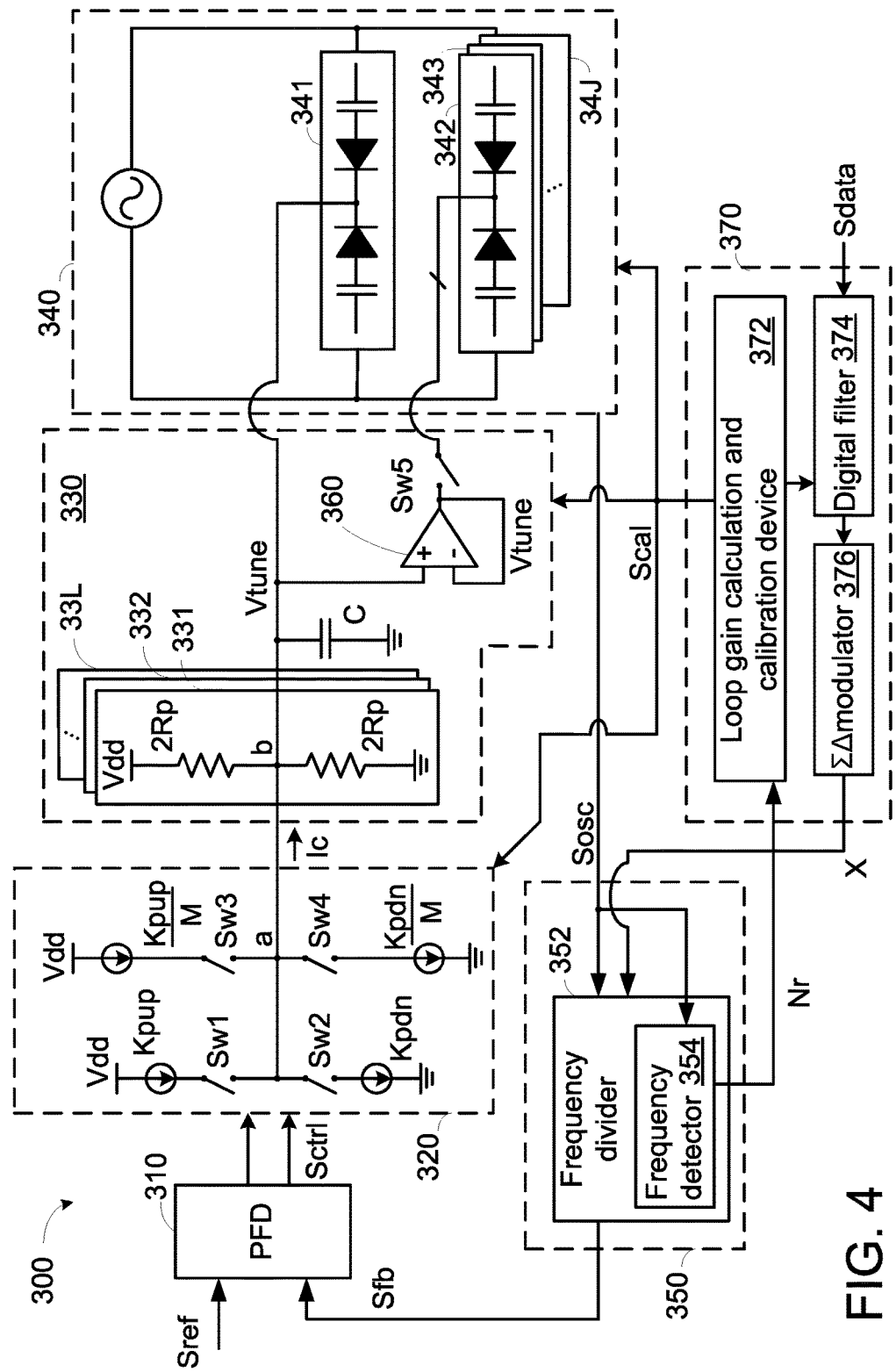
FIG. 4 is a schematic circuit diagram illustrating a phase-locked loop circuit according to a second embodiment of the present invention.

FIG. 4 is a schematic circuit diagram illustrating a phase-locked loop circuit according to a second embodiment of the present invention. As shown in FIG. 4, the phase-locked loop circuit 300 comprises a phase frequency detector (PFD) 310, a charge pump 320, a loop filter 330, a voltage controlled oscillator (VCO) 340, a feedback circuit 350 and a digital signal processor 370.

The phase frequency detector 310 receives a reference signal Sref and a feedback signal Sfb, and generates a control signal Sctrl.

The charge pump 320 comprises a first charging path, a first discharging path, a second charging path and a second discharging path. The circuitry configurations and the operating principles of the charge pump 320 are similar to the charge pump of the first embodiment, and are not redundantly described herein.

As shown in FIG. 4, the loop filter 330 comprises an RC circuit and a unit gain buffer 360. According to the driving current Ic from the charge pump 320, a charge/discharge control operation is performed on the RC circuit. Consequently, the loop filter 330 generates a tuned voltage Vtune to the voltage controlled oscillator 340. The circuitry configurations and the operating principles of the loop filter 330 are similar to the loop filter of the first embodiment, and are not redundantly described herein.

The voltage controlled oscillator 340 receives the tuned voltage Vtune and generates an oscillation signal Sosc. As shown in FIG. 4, the voltage controlled oscillator 340 comprises plural variable capacitance devices 341~34J. All of the variable capacitance devices 341~34J receive the tuned voltage Vtune. The circuitry configurations and the operating principles of the voltage controlled oscillator 340 are similar to the voltage controlled oscillator of the first embodiment, and are not redundantly described herein.

In this embodiment, the feedback circuit 350 comprises a frequency divider 352 and a frequency detector 354. According to the practical requirements, the frequency detector 354 is installed in the frequency divider 352 or disposed outside the frequency divider 352. Moreover, during the calibrating process of the phase-locked loop circuit 300, the frequency detector 354 generates a count number Nr according to the oscillation signal Sosc and thus calculates the frequency of the oscillation signal Sosc.

During the calibrating process, the frequency divider 352 performs a frequency division on the oscillation signal Sosc according to a fixed divisor. Consequently, the feedback signal Sfb is outputted from the frequency divider 352 to the phase frequency detector 310. Moreover, during a normal operation of the phase-locked loop circuit 300, the frequency divider 352 dynamically adjusts the divisor according to a divisor control signal X and performs a frequency division on the oscillation signal Sosc according to the adjusted divisor. Consequently, the feedback signal Sfb is outputted from the frequency divider 352 to the phase frequency detector 310.

The digital signal processor 370 comprises a loop gain calculation and calibration device 372, a digital filter 374 and a sigma-delta (ΣΔ) modulator 376.

During the calibrating process of the phase-locked loop circuit 300, a calibration signal Scal is outputted from the loop gain calculation and calibration device 372 to the charge pump 320, the loop filter 330 and the voltage controlled oscillator 340. Moreover, during the calibrating process, the first charging path and the second discharging path are sequentially enabled, and the first real count number Nr1 and the second real count number Nr2 are sequentially outputted from the frequency detector 354.

Moreover, a first ideal count number Ni1 and a second ideal count number Ni2 are stored in the digital signal processor 370. Consequently, the loop gain calculation and calibration device 372 calculates a ratio of a real loop gain LGr to an ideal loop gain LGi. Moreover, according to the ratio of the real loop gain LGr to the ideal loop gain LGi, the digital signal processor 370 adjusts the digital filter 374 to compensate the real loop gain LGr.

Moreover, during the normal operation, a data signal Sdata is inputted into the digital filter 374 and modulated by the sigma-delta modulator 376. Consequently, the divisor control signal X is outputted to the frequency divider 352. After the divisor is dynamically adjusted according to a divisor control signal X, the outputted oscillation signal Sosc contains the information of the data signal Sdata.

The calibrating process of the phase-locked loop circuit 300 is similar to the flowchart of FIG. 3. In this embodiment, after the ratio of the real loop gain to the ideal loop gain is obtained, the first charging current, the first discharging current, the RC time constant of the RC circuit or the VCO gain Kvco of the voltage controlled oscillator is adjusted according to the ratio. Consequently, the real loop gain is compensated. Moreover, in this embodiment, the digital filter 374 can be employed to compensate the real loop gain.

Figure 5:
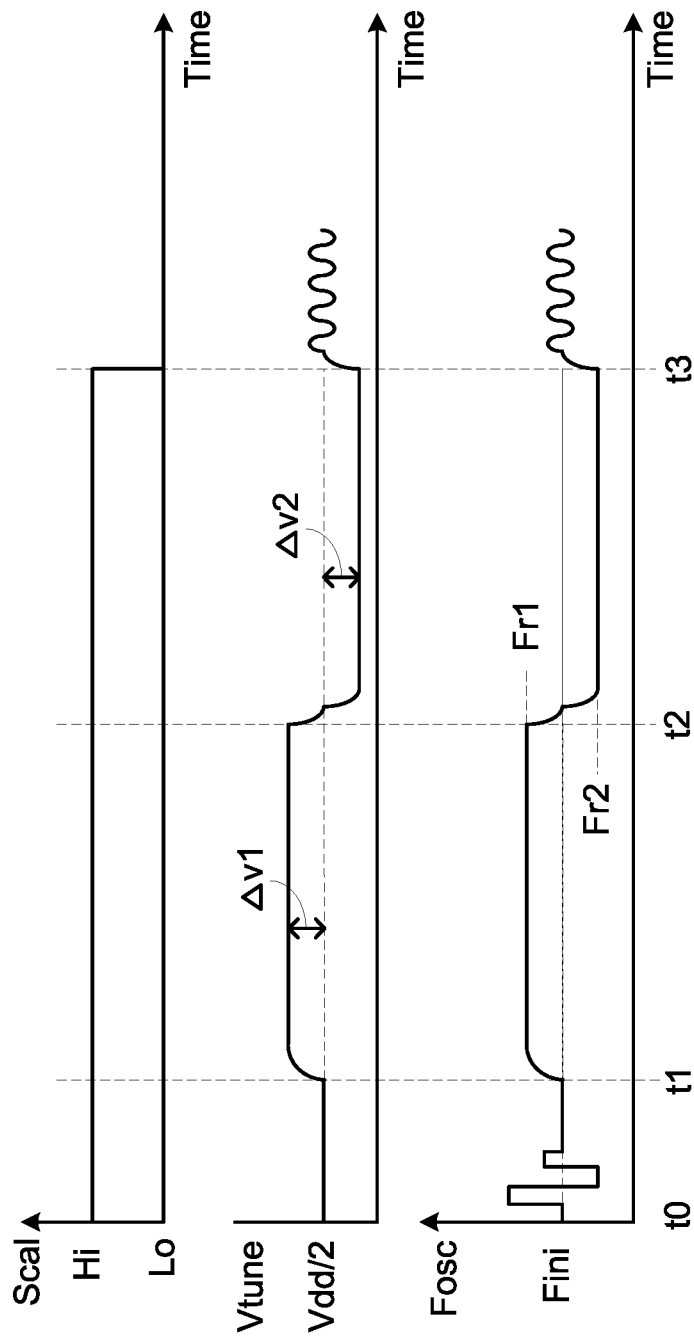
FIG. 5 is a schematic timing waveform diagram illustrating associated signal of the phase-locked loop circuit according to the second embodiment of the present invention.

FIG. 5 is a schematic timing waveform diagram illustrating associated signal of the phase-locked loop circuit according to the second embodiment of the present invention.

In the time interval between the time point t0 and the time point t3, a high level state of the calibration signal Scal indicates the calibrating process of the phase-locked loop circuit 300. After the time point t3, the low level state of the calibration signal Scal indicates the normal operation of the phase-locked loop circuit 300.

In the time interval between the time point t0 and the time point t1, a bias voltage applied to the phase-locked loop circuit 300 is adjusted. Consequently, the tuned voltage Vtune is adjusted to be one half of the supply voltage (i.e., Vtune=Vdd/2), and the voltage controlled oscillator 340 generates an oscillation signal Sosc with an initial frequency Fini.

In the time interval between the time point t1 and the time point t2, the second charging current generated by the second charging path is used as the driving current Ic and sent to the loop filter 330. According to the driving current Ic, a first voltage change amount Δv1 is generated by the loop filter 330. Consequently, the tuned voltage Vtune is changed to (Vdd/2+Δv1). Moreover, the voltage controlled oscillator 340 generates the oscillation signal Sosc according to the tuned voltage Vtune, and the frequency detector 354 issues a first real count number Nr1. Consequently, a first real frequency Fr1 of the oscillation signal Sosc is calculated according to the first real count number Nr1.

In the time interval between the time point t2 and the time point t3, the second discharging current generated by the second charging path is used as the driving current Ic and sent to the loop filter 330. According to the driving current Ic, a second voltage change amount Δv2 is generated by the loop filter 330. Consequently, the tuned voltage Vtune is changed to (Vdd/2−Δv2). Moreover, the voltage controlled oscillator 340 generates the oscillation signal Sosc according to the tuned voltage Vtune, and the frequency detector 354 issues a second real count number Nr2. Consequently, a second real frequency Fr2 of the oscillation signal Sosc is calculated according to the second real count number Nr2.

After the time point t3, the loop gain calculation and calibration device 372 calculates the ratio of the real loop gain LGr to the ideal loop gain LGi according to the first real count number Nr1, the second real count number Nr2, the first ideal count number Ni1 and the second ideal count number Ni2. Moreover, according to the ratio of the real loop gain LGr to the ideal loop gain LGi, the digital signal processor 370 adjusts the digital filter 374 to compensate the real loop gain LGr.

Moreover, after the time point t3, the phase-locked loop circuit 300 is normally operated. The data signal Sdata is inputted into the digital filter 374 and modulated by the sigma-delta modulator 376. Consequently, the divisor control signal X is outputted to the frequency divider 352. After the divisor of the frequency divider 352 is dynamically adjusted according to a divisor control signal X, the frequency Fosc of the outputted oscillation signal Sosc is changed with the data signal Sdata.

From the above descriptions, the present invention provides a phase-locked loop circuit and a calibrating method for the phase-locked loop circuit. During the calibrating process of the phase-locked loop circuit, the oscillation signal Sosc is adjusted to be operated at two different frequencies and the numbers of signal edges of the oscillation signal Sosc in the time interval Tw are counted. According to the difference between the two count numbers, a ratio of the real loop gain to the ideal loop gain is calculated. Moreover, the first charging current, the first discharging current, the RC time constant of the RC circuit or the VCO gain Kvco of the voltage controlled oscillator is adjusted according to the ratio. Consequently, the loop gain of the phase-locked loop circuit can be compensated.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A phase-locked loop circuit, comprising:
   a phase frequency detector receiving a reference signal and a feedback signal, and generating a control signal;
   a charge pump receiving the control signal, and generating a driving current, wherein the charge pump comprises a first charging path, a first discharging path, a second charging path and a second discharging path, wherein a first charging current is provided by the first charging path, a first discharging current is provided by the first discharging path, a second charging current is provided by the second charging path, and a second discharging current is provided by the second discharging path;
   a loop filter receiving the driving current, and generating a tuned voltage, wherein the loop filter comprises an RC circuit and a unit gain buffer, wherein the RC circuit is connected with a node, the RC circuit generates the tuned voltage at the node according to the driving current, and an input terminal of the unit gain buffer is connected with the node;
   a voltage controlled oscillator receiving the tuned voltage, and generating an oscillation signal, wherein the voltage controlled oscillator comprises plural variable capacitance devices, wherein a first variable capacitance device of the plural variable capacitance devices is connected with the node to receive the tuned voltage, and the other variable capacitance devices of the plural variable capacitance devices are connected with an output terminal of the unit gain buffer through a switch so as to receive the tuned voltage; and
   a feedback circuit comprising a frequency divider and a frequency detector, wherein the frequency divider performs a frequency division on the oscillation signal according to a divisor, so that the feedback signal is outputted from the frequency divider, wherein the frequency detector counts the oscillation signal,
   wherein during a calibrating process, the switch is in a closed state and the second charging current or the second discharging current is used as the driving current, wherein during a normal operation, the switch is in an open state and the first charging current or the first discharging current is used as the driving current.

2. The phase-locked loop circuit as claimed in claim 1, wherein the first charging current is larger than the second charging current, and the first discharging current is larger than second discharging current, wherein the second charging current is in proportion to the first charging current, and the second discharging current is in proportion to the first discharging current.

3. The phase-locked loop circuit as claimed in claim 1, wherein the RC circuit comprises:
   a capacitor connected between the node and a ground terminal; and
   at least one resistive circuit connected with the node, wherein each resistive circuit comprises a first resistor and a second resistor, wherein the first resistor is connected between a supply voltage and the node, and the second resistor is connected between the node and the ground terminal.

4. The phase-locked loop circuit as claimed in claim 1, wherein during the normal operation, the switch is in the open state, so that the other variable capacitance devices of the plural variable capacitance devices receives a DC voltage.

5. A calibrating method for the phase-locked loop circuit according to claim 1, the calibrating method comprising steps of:
   adjusting a bias voltage of the phase-locked loop circuit, so that the voltage controlled oscillator generates the oscillation signal with an initial frequency;
   controlling the second charging current of the second charging path to be used as the driving current, wherein the tuned voltage is increased by a first voltage change amount according to the driving current, and the frequency detector issues a first real count number;
   controlling the second discharging current of the second discharging path to be used as the driving current, wherein the tuned voltage is decreased by a second voltage change amount according to the driving current, and the frequency detector issues a second real count number; and
   calculating a ratio of a real loop gain to an ideal loop gain according to the first real count number and the second real count number, and adjusting the first charging current, the first discharging current, a RC time constant of the RC circuit or a VCO gain of the voltage controlled oscillator according to the ratio.

6. The calibrating method as claimed in claim 5, wherein a first ideal count number and a second ideal count number are stored in a digital signal processor of the phase-locked loop circuit, wherein after a first difference between the first real count number and the second real count number is divided by a second difference between the first ideal count number and the second ideal count number, the ratio of the real loop gain to the ideal loop gain is obtained.

7. A phase-locked loop circuit, comprising:
   a phase frequency detector receiving a reference signal and a feedback signal, and generating a control signal;
   a charge pump receiving the control signal, and generating a driving current, wherein the charge pump comprises a first charging path, a first discharging path, a second charging path and a second discharging path, wherein a first charging current is provided by the first charging path, a first discharging current is provided by the first discharging path, a second charging current is provided by the second charging path, and a second discharging current is provided by the second discharging path;
   a loop filter receiving the driving current, and generating a tuned voltage, wherein the loop filter comprises an RC circuit and a unit gain buffer, wherein the RC circuit is connected with a node, the RC circuit generates the tuned voltage at the node according to the driving current, and an input terminal of the unit gain buffer is connected with the node;
   a voltage controlled oscillator receiving the tuned voltage, and generating an oscillation signal, wherein the voltage controlled oscillator comprises plural variable capacitance devices, wherein a first variable capacitance device of the plural variable capacitance devices is connected with the node to receive the tuned voltage, and the other variable capacitance devices of the plural variable capacitance devices are connected with an output terminal of the unit gain buffer through a switch so as to receive the tuned voltage;
   a feedback circuit comprising a frequency divider and a frequency detector, wherein the frequency divider performs a frequency division on the oscillation signal according to a divisor, so that the feedback signal is outputted from the frequency divider, wherein the frequency detector counts the oscillation signal; and
   a digital signal processor comprising a loop gain calculation and calibration device and a digital filter, wherein the loop gain calculation and calibration device adjusts the digital filter according to plural count numbers from the frequency detector,
   wherein during a calibrating process, the switch is in a closed state and the second charging current or the second discharging current is used as the driving current, wherein during a normal operation, the switch is in an open state and the first charging current or the first discharging current is used as the driving current.

8. The phase-locked loop circuit as claimed in claim 7, wherein the first charging current is larger than the second charging current, and the first discharging current is larger than second discharging current, wherein the second charging current is in proportion to the first charging current, and the second discharging current is in proportion to the first discharging current.

9. The phase-locked loop circuit as claimed in claim 7, wherein the RC circuit comprises:
   a capacitor connected between the node and a ground terminal; and
   at least one resistive circuit connected with the node, wherein each resistive circuit comprises a first resistor and a second resistor, wherein the first resistor is connected between a supply voltage and the node, and the second resistor is connected between the node and the ground terminal.

10. The phase-locked loop circuit as claimed in claim 7, wherein during the normal operation, the switch is in the open state, so that the other variable capacitance devices of the plural variable capacitance devices receives a DC voltage.

11. The phase-locked loop circuit as claimed in claim 7, wherein the digital signal processor further comprises a sigma-delta modulator, wherein during the calibrating process, the loop gain calculation and calibration device receives a first real count number and a second real count number from the frequency detector, and adjusts the digital filter, wherein during the normal operation, a data signal is inputted into the digital filter and modulated by the sigma-delta modulator, so that a divisor control signal is generated to control the divisor frequency divider.

12. A calibrating method for the phase-locked loop circuit according to claim 7, the calibrating method comprising steps of:
   adjusting a bias voltage of the phase-locked loop circuit, so that the voltage controlled oscillator generates the oscillation signal with an initial frequency;
   controlling the second charging current of the second charging path to be used as the driving current, wherein the tuned voltage is increased by a first voltage change amount according to the driving current, and the frequency detector issues a first real count number;
   controlling the second discharging current of the second discharging path to be used as the driving current, wherein the tuned voltage is decreased by a second voltage change amount according to the driving current, and the frequency detector issues a second real count number; and
   calculating a ratio of a real loop gain to an ideal loop gain according to the first real count number and the second real count number, and adjusting the digital filter according to the ratio.

13. The calibrating method as claimed in claim 12, wherein a first ideal count number and a second ideal count number are stored in the digital signal processor, wherein after a first difference between the first real count number and the second real count number is divided by a second difference between the first ideal count number and the second ideal count number, the ratio of the real loop gain to the ideal loop gain is obtained.

\* \* \* \* \*